(12) United States Patent
Angelopoulos et al.

(10) Patent No.: US 9,203,441 B2
(45) Date of Patent: Dec. 1, 2015

(54) PARTIAL PACKET RECOVERY IN WIRELESS NETWORKS

(75) Inventors: Georgios Angelopoulos, Cambridge, MA (US); Muriel Medard, Belmont, MA (US); Anantha P. Chandrakasan, Belmont, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 306 days.

(21) Appl. No.: 13/483,659

(22) Filed: May 30, 2012

(65) Prior Publication Data

US 2013/0326308 A1 Dec. 5, 2013

(51) Int. Cl.
*H03M 13/00* (2006.01)
*H03M 13/37* (2006.01)
*H03M 13/09* (2006.01)

(52) U.S. Cl.
CPC ........ *H03M 13/373* (2013.01); *H03M 13/3746* (2013.01); *H03M 13/3761* (2013.01); *H03M 13/6306* (2013.01); *H03M 13/09* (2013.01)

(58) Field of Classification Search
CPC .......... H03M 13/373; H03M 13/3746; H03M 13/3761; H03M 13/6306; H03M 13/09
USPC ......... 714/746, 748, 751, 752, 755, 756, 763, 714/784, 799, 780, 52; 455/30, 226.1, 455/226.3
See application file for complete search history.

(56) References Cited

U.S. PATENT DOCUMENTS

| 8,205,140 | B2* | 6/2012 | Hafeez et al. ................. 714/776 |
| 8,341,504 | B2* | 12/2012 | Hassan et al. ................. 714/776 |
| 8,443,248 | B2* | 5/2013 | Eckert ........................... 714/749 |
| 8,732,559 | B2* | 5/2014 | Liu et al. ....................... 714/776 |
| 2008/0117904 | A1 | 5/2008 | Radha et al. |
| 2010/0302996 | A1 | 12/2010 | Matsumoto et al. |

FOREIGN PATENT DOCUMENTS

WO 2008/013528 * 1/2008

OTHER PUBLICATIONS

K.C.-J. Lin et al., "ZipTx: Harnessing partial packets in IEEE 802.11 networks," Proc. of the 14th ACM Int'l. Conf. on Mobile Computing and Networking, 2008, pp. 351-362.

* cited by examiner

*Primary Examiner* — Christine Tu
(74) *Attorney, Agent, or Firm* — Talem IP Law, LLP

(57) ABSTRACT

Systems and methods for improved packet throughput using partial packets are provided in which data recovery of partial packets of a plurality of received coded packets is performed across the plurality of received coded packets. The plurality of received coded packets, including the received partial packets, can be buffered in a memory and used in recovering the data for the partial packets. As soon as the total number of received packets (including valid and partial) becomes greater than the generation size, a decoding process can be attempted utilizing the partial packets as part of the redundancy used for data recovery. During the decoding process, the received packets are evaluated across packets instead of on a per-packet basis.

20 Claims, 6 Drawing Sheets

PARTIAL PACKET RECOVERY IN WIRELESS NETWORKS

BACKGROUND

As wireless networks become more ubiquitous, research continues to be conducted to improve resource utilization as well as power consumption. One area of interest is the recovery of transmitted data. Data transmitted over a wireless network can become degraded due to transmission issues including, but not limited to, channel attenuation, fading, noise and interference. The quality of the data received from a wireless network can suffer from one or more transmission issues and result in erroneous received bits. Many current wireless networks use physical layer error correcting techniques, such as error correcting codes, to increase reliability and data link layer error detection methods to discard received packets containing errors so that erroneous information is not propagated through the system. Thus, in many wireless networks, when a packet is received at the data link layer, the packet is checked for errors and either discarded or propagated to higher layers of the system. This "all-or-nothing" mode is often implemented using cyclic redundancy checks (CRC) and other error detection codes in order to determine the validity of received packets before forwarding the valid received packets to higher layers.

Unfortunately, discarding packets that do not satisfy the validity check and requesting a retransmission of the entire packet is inefficient in terms of resource utilization since packets found to contain errors usually still have a large amount of useful information. Furthermore, lower resource utilization and increased overall power consumption is often the result of not being able to exploit the information received during a first transmission of a data packet.

BRIEF SUMMARY

Techniques are disclosed for reducing data retransmission requests in communication networks. Certain embodiments provide a partial packet recovery framework, which can be implemented as a transparent and physical layer agnostic data link layer process, or a physical layer dependent process requiring less execution time compared to the previous one.

In accordance with embodiments of the invention, packets that are transmitted from a source to a target are coded together and the decoding of packets can begin without waiting for a particular number of valid packets received by taking advantage of partial packets received.

According to an embodiment, the partial packets are buffered and the potentially error free portions of the partial packets can be used for data recovery. Data recovery is performed using portions of the partial packets and the redundancy needed to perform data recovery is spread across several packets.

In one embodiment, the received packets are evaluated in sections. A section of each of several packets is processed together for recovery and decoding across the several packets. A successful decoding occurs when all the sections of each packet have been processed successfully. A section can be one or more symbols or a plurality of bits.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DISCLOSURE

Figures 1, 2A, 2B:
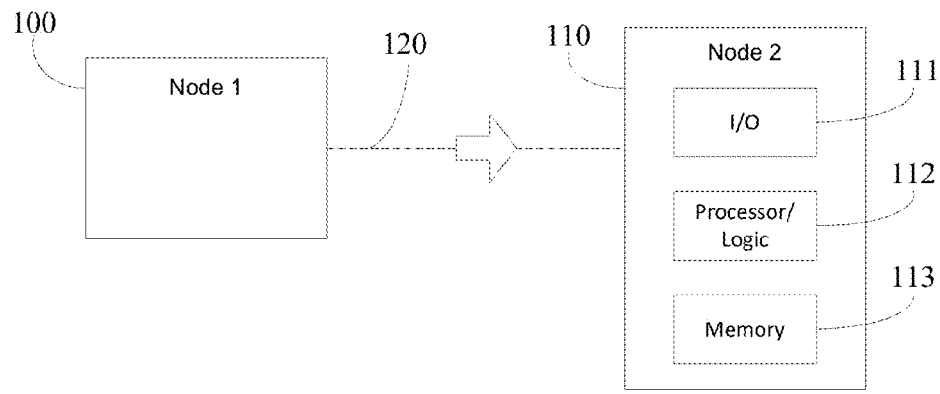
FIG. 1 shows a simplified network representation for describing a network on which an embodiment of the invention can be implemented.
FIGS. 2A and 2B show representations of received packets and associated coefficients for describing error correction and data recovery in accordance with various embodiments of the invention.

Techniques and systems for partial packet recovery are disclosed herein. Embodiments of the subject techniques can be referred to as Partial Packet Reception with Network Coding (PPRNC). Embodiments can extract useful information from partial packets, resulting in a reduction in the number of retransmitted packets. In accordance with various embodiments of the invention, the number of retransmitted packets can be reduced by enabling a pooling of resources across several packets.

In one embodiment, PPRNC can be applied in a wide variety of applications, increasing communication throughput and reducing the required amount of energy for transmission. Applications to which PPRNC can be applied include, but are not limited to, high-speed wireless networks such as wireless local area networks (WLANs) and low-data rate, energy-constrained sensor networks.

In a typical wireless system, a received packet, after having been processed by the physical layer, is discarded if the packet is determined to contain a number of erroneous bits equal to or greater than one in order to not propagate erroneous information to the higher layers of the protocol stack. Some systems use a form of automatic repeat request (ARQ) to obtain additional packets. For example, partial packets may be discarded at the destination and another copy of the packet requested to be re-sent by the source. However, dropping partial packets and requesting a retransmission of the entire packet can be inefficient in terms of resource utilization, since partial packets often have a large amount of useful information. For networks using coded packet transmission, decoding of valid packets are generally carried out before propagating the information to the higher layers.

According to an embodiment, Network Coding (NC) is a cross-packet coding technique, which enables recovery of the initial packets transmitted from a source (sender) to the destination (receiver) when the number of valid received coded packets becomes equal to the generation size.

A "valid packet" refers to a packet determined to satisfy a validity check. An "initial packet" refers to the data packet originally sent from a transmitting node.

The "generation size" refers to the number of packets in a group or "generation" encoded together for transmission as coded packets from a source (or "sender"). "DOF" refers to a coded packet for transmission, which is a linearly independent combination of initial data packets. The receiver requires at least M DOFs to decode the M initial packets (packets transmitted from a sender).

In accordance with embodiments of the invention, by relying on transmission of coded packets, there is no need to specify a particular data packet to retransmit, as needed by various ARQ techniques. Instead, a random linear combination of data packets may be used.

The systems and techniques of embodiments of the invention do not require a fixed number of coded packets be transmitted. Furthermore, the packet size is not restricted.

A simple network representation is illustrated in FIG. 1. As shown in FIG. 1 a first network node 100 can function as a source ("transmitting node") that transmits data to a destination, such as a second network node 110 ("receiving node"), over a channel (also referred to as a "link") 120. The channel 120 may be physical (e.g., wired) or wireless (or a combination of wired and wireless). In addition, the path between the first node and the second node may not be direct (other nodes may be involved in transmitting a packet between the first node and the second node). Noise and other issues, such as packet erasure, may arise along the channel 120.

Packets transmitted from the first node 100 can be received by the second node 110 through an input port (I/O 111). For certain wireless communication implementations, the input port 111 can include an antenna and receiver circuitry. Processing of the incoming packets can be performed by a processor or logic unit 112. Routing and other processes can be carried out by the processor 112 by executing computer-readable instructions stored in a computer-readable media. For example, the second node 110 can also include at least one memory 113 for storing programs executed by the processor 112 as well as providing a buffer or storage for incoming packets and data.

In certain applications, the first node 100 and the second node 110 may each be able to perform the functions of both a transmitting node and a receiving node. When one or both of the first node and the second node can function as both a transmitting node and a receiving node, the node may either be able to perform both functions at the same time or only one of the two functions at a time (e.g., communicating over a time division duplexing/half-duplex channel).

It should be understood that while only two nodes are illustrated in FIG. 1 for simplicity, multiple nodes may be transmitting and/or receiving within the network (e.g., a multi-terminal wireless network). In various implementations, at least some of the nodes may include the functionality of both a receiver and transmitter depending on the particular application. In addition, one or both of the nodes can provide a redistribution point or a terminal. The particular implementation of one or both of the nodes depends on the network and protocol layer.

In accordance with certain embodiments of the invention, the network may be any suitable communications network including, but not limited to, a cellular (e.g., wireless phone) network, the Internet, a local area network (LAN), a wide area network (WAN), a WiFi network, or a combination thereof. Such networks are widely used to connect various types of network elements, such as routers, servers, and gateways. It should also be understood that the invention can be practiced in a multi-network environment having various connected public and/or private networks. As will be appreciated by those skilled in the art, communication networks can take several different forms and can use several different communication protocols.

Network architecture generally follows the Open System Interconnection (OSI) model in which communication functions are grouped into layers according to their concerns and capabilities. The OSI model provides seven layers. The lower layers of the OSI model are the physical layer, the data link layer, the network layer, and the transport layer. The first (and lowest) layer is the physical layer (also referred to as the PHY layer), which typically involves the electrical and physical specifications for a device and its relationship with a transmission medium (e.g., hardware implementations). The second layer is the data link layer, which generally provides functions and features for transferring data between entities over a network and detect and/or correct errors occurring on the physical layer. The data link layer often includes media/medium access control (MAC) sublayer for communicating with the physical layer and a logical link control (LLC) sublayer for providing transparent services to the network layer. The LLC sublayer of the data link, layer provides "transparent" services by enabling the network layer to work without having to know the details of the physical layer.

Various embodiments of the invention are implemented in the data link layer and can be completely independent of the physical layer. In accordance with certain embodiments, a data link layer process is provided for partial packet recovery without requiring access to PHY's soft information as used in cross-layer approaches. In a further embodiment, PHY's soft information is provided at the data link layer to reduce the execution time of the data recovery methods described herein. However, as mentioned above, the soft information is not a prerequisite for the data recovery methods.

A "partial packet" refers to a packet determined to contain at least one erroneous bit during a validity check.

"Soft information" refers to physical layer confidence metrics or hints (e.g., estimates regarding how close the bit passed to the physical layer was to the received channel value corresponding to that bit) and estimates about the received information, which may be provided by the physical layer to higher layers. For example, in one system every decoded bit from the physical layer to the data link layer is annotated with an extra confidence hint, in order to enable the data link layer to identify which chunks of a packet have a high probability of being erroneous and request only these parts.

The third and fourth layers of the OSI model are the network layer, which is directed to protocols for routing, and the transport layer, which is directed to source-to-destination delivery of data received from the upper three layers (the session layer, presentation layer and application layer). The upper three layers convert user input into the data passed down through the lower layers and are generally provided as software at a host.

As mentioned above, if the communication pair of the first node 100 and the second node 110 uses ARQ, partial packets are discarded at the destination (e.g., the second node 110) and requested to be re-sent by the source (e.g., the first node 110). If N packets have to be transmitted through the link 120 with an erasure probability p, then the expected number of transmitted packets is:

$$\overline{N} = \frac{N}{1-p}.$$

Making use of NC does not reduce the expected number of transmitted packets for this simplified network. Instead, the addition of NC to an ARQ-based operation of the communication pair adds in the element of initial packet recovery of valid packets by performing an NC decoding process when the number of valid packets becomes equal to the generation size. The NC decoding process, having enough valid DOFs, can recover the initial packets using the equation:

$$P_{init} = C_{val}^{-1} * P'_{val},$$

where $P_{init}$ are the initial packets, $P'_{val}$ are the valid coded packets and $C_{val}$ are the coefficients associated with them.

FIG. 2A shows a representation of received packets and associated coefficients. As shown in FIG. 2A, some of the bits in the received packets ($P'_1$, $P'_2$, $P'_3$, $P'_4$, $P'_5$) are erroneous, which may occur due to corruption from the channel 120 when the packets are transmitted from the first node 100 to the second node 110. In this particular example, the generation size equals three, the Galois Field GF($2^4$) is used and each packet has 16 bits. The standard NC decoding process (using the NC initial packet recovery equation above) will be initiated right after the reception of $P'_5$ ($P'_1$, $P'_3$ and $P'_5$ are the three required valid DOFs). Accordingly, it can be seen that information contained in packets $P'_2$ and $P'_4$, which are the partial packets, is not exploited by NC.

Instead of waiting for the number of valid packets to be equal to the generation size, methods and systems are provided that enable a physical layer agnostic recovery mechanism and the exploitation of the information contained in partial packets. A "physical layer agnostic" process refers to a process that is independent of the physical layer, such as being designed as a data link layer process.

In accordance with various embodiments, PPRNC can be efficiently incorporate in any firmware or driver of current wireless cards since it is physical layer independent and can also be transparent to higher layers. PPRNC can also be incorporated in systems that provide physical layer information to higher layers, resulting in even better performance (e.g., reduced execution time). Embodiments can be implemented in hardware, software, or a combination of hardware and software. In various embodiments, PPRNC is designed as a data link layer process executed by a processor. PPRNC can be incorporated into any communication protocol. PPRNC may be particularly helpful in networks operating under challenged conditions, including poor signal to noise ratios (SNR).

In one embodiment of PPRNC, when the physical layer returns a partial packet (i.e., indicates that a partial packet was received), the partial packet is buffered by the link layer and automatically becomes a redundancy for all the other packets across the packet's generation. However, when packets are received without errors, no extra overhead is associated with them.

In accordance with certain embodiments of the invention, as soon as the total number of incoming packets (including valid and partial) becomes greater than the generation size, the decoding process is attempted utilizing the partial packets. An example of the PPRNC methodology is described with respect to the received packets and associated coefficients represented in FIG. 2B. For this example, because the generation size is 3, once the first four packets of FIG. 2A have been received ($P'_1, \ldots, P'_4$), the decoding process can be attempted. Thus, for this example, there is a certain probability that PPRNC would be able to recover the three initial packets based on the two valid ($P'_1, P'_3$) and two partial packets ($P'_2, P'_4$) without requiring an additional packet to be sent or re-transmitted. The PPRNC technique processes the four buffered packets ($P'_1, \ldots, P'_4$), working across columns, and finishes the recovery process only when all columns are successfully decoded. Otherwise, a failure is declared and a new packet (such as $P'_5$ of FIG. 2A) is requested.

Considering the first column (e.g., the first symbol of every packet) of the example shown in FIG. 2B, since no error has occurred, the receiver should ideally be able to recover this part of the packets. But, since $P'_2$ and $P'_4$ do not satisfy the CRC rule, the receiver does not know if $p'_{21}$ (first symbol of $P'_2$) and/or $p'_{41}$ (first symbol $P'_4$) are erroneous. In accordance with an embodiment of the invention, PPRNC checks the validity of these symbols using a consistency check rule, which is based on NC. A consistency check performs block-by-block verification to ensure that all the data in the packet part is consistent with the expected data.

In one embodiment, the consistency check rule examines the coefficients' correctness by regenerating the packet and comparing the packet with its current value. Since symbols of the first column are correct, the result of the check is positive and the symbols are considered correct. With a positive result from the consistency check, the NC decoding process described above can be initiated with any three out of the four correct symbols and their associated coefficients, recovering the first column of the initial packets.

For instance, consider the first symbols of packets $P'_1, P'_2$ and $P'_3$, namely $p'_{11}, p'_{21}$ and $p'_{31}$. Based on the consistency check, the first column of symbols are assumed to be correct and the NC decoding process can be performed as follows:

$$\begin{bmatrix} p_{11}^* \\ p_{21}^* \\ p_{31}^* \end{bmatrix} = \begin{bmatrix} C_1 \\ C_2 \\ C_3 \end{bmatrix}^{-1} \times \begin{bmatrix} p'_{11} \\ p'_{21} \\ p'_{31} \end{bmatrix},$$

where the notation "'" indicates coded symbols and packets, the notation "*" indicates guessed or estimated symbols and regular notation for initial packets. As indicated by the above, a guess is made for the first symbol of initial packets $P_1, P_2$ and $P_3$; and these symbols are multiplied with the coefficients associated with $P'_4$ resulting in:

$$p'^*_{41} = C_4 \times \begin{bmatrix} p_{11}^* \\ p_{21}^* \\ p_{31}^* \end{bmatrix}.$$

The final result $P'_{41}*$ is compared with the first symbol of the last packet ($p'_{41}$). If the comparison result is invalid, then an error exists in $p'_{21}$ and/or $p'_{41}$ ($p'_{11}$ and $p'_{31}$ belong to valid packets so they are considered correct). Otherwise, with high probability, the first column of packets does not contain erroneous symbols and the guessed symbols ($p_{11}*, p_{21}*$ and $p_{31}*$) are correct. In the latter case, there is also a probability for a false positive event ($p_{fpe}$), as with any other checking rule. Assuming that $p'_{41}*$ and $p'_{41}$ independent, the false positive event rate depends only on the value of field size. In one embodiment, the field size can be increased in order to set $p_{fpe}$ under a desired threshold. In another embodiment, $p_{fpe}$ is lowered by running multiple consistency checks, related to as consistency check rounds, for the same column but considering different set of symbols each time. In the example, the second round could be performed by using $p'_{11}$, $p'_{21}$ and $p'_{41}$ at the NC decoding process and $p'_{31}$ at the final comparison. The consistency check rounds can continue to be performed, decreasing $p_{fpe}$ exponentially until a desired threshold is met.

The probability of a false positive event ($p_{fpe}$) of the check rule of the above described embodiment is:

$$p_{fpe} = \left(\frac{1}{2^q}\right)^r$$

where q is the length of each symbol or equivalently, the size of the Galois Field used, and r is the number of consistency check rounds.

Figure 3:
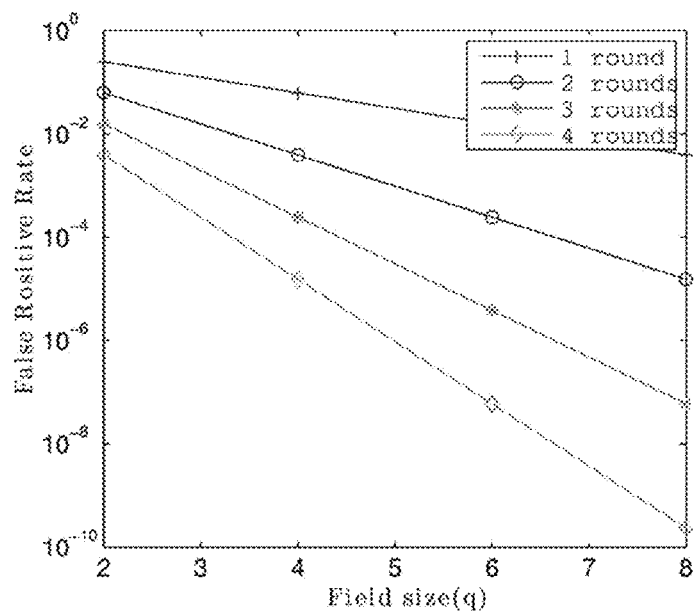
FIG. 3 shows a plot indicating false positive event rate versus field size for 1, 2, 3, and 4 consistency check rounds.

Based on the above probability, by using a field size of four and two rounds of consistency check $p_{fpe}$ equals $\frac{1}{2^8}$, which is the same as the false positive event rate of an 8-bit CRC rule. FIG. 3 shows the false positive event rate for different values of field size and number of consistency check rounds. The desired value of $p_{fpe}$ is an application specific choice and can be adjusted depending on the available computational resources and the desired algorithmic performance.

Returning again to FIG. 2B, after a successful column recovery, PPRNC continues with the next column (e.g., the next symbol of each packet). Considering the second column, the consistency check is not satisfied owing to the error at the second packet. Since the receiver knows that $P'_2$ and $P'_4$ contain errors, an iterative correction process can be initiated in order to identify the correct values of symbols $p'_{22}$ and $p'_{42}$. After detecting an erroneous column, the communication protocol should either request for retransmission of the symbols belonging to partial packets or trigger a correction mechanism to recover their initial values. An iterative correction process can be preferred in cases where the application's specific parameters are optimized by minimizing retransmitted packets. In one embodiment, a searching algorithm is used to try different possible combinations, starting with the ones of highest probability of occurrence, until the consistency is satisfied. In the case that soft information is available to the data link layer, the searching algorithm starts by examining the combinations indicated as the least confident. In that way, the expected execution time is reduced, improving efficiency. The consistency check will be satisfied when the correction process finds the correct symbol values.

Once the consistency check indicates that the second column contains correct symbol values, the NC decoding process can be initiated, recovering the symbols of the second column. In addition to specifying the correct values of the examined symbols, the CRC status can be updated for the packets, potentially reducing the number of packets marked as partial at the next steps of the recovery algorithm and significantly speeding up the recovery algorithm. In this example, because $P'_2$ and $P'_4$ also contain other errors, their CRC status is not changed after the end of second column's recovery. However, the CRC status of $P'_2$ can be changed after the end of the third column's recovery. By handling the columns in this manner, the initially transmitted packets can be successfully recovered.

Figure 4:
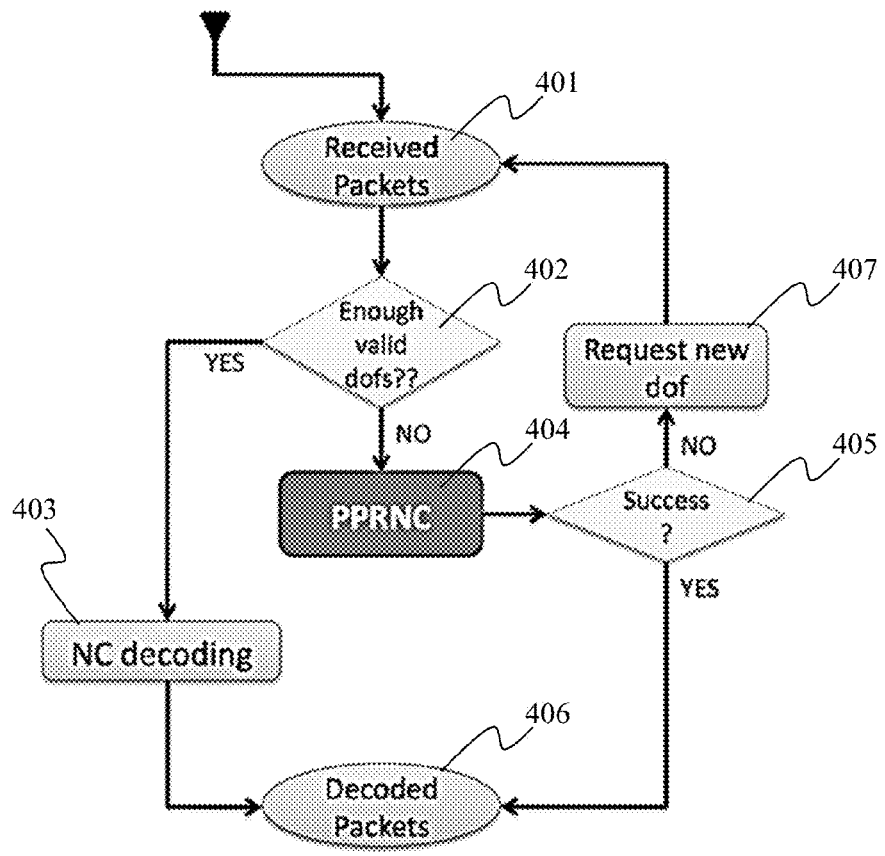
FIG. 4 shows a flow chart illustrating an embodiment of the invention in which network coding as well as decoding of received packets is performed even when the number of valid packets is less than the required.

FIG. 4 illustrates a simplified process flow diagram in accordance with an embodiment of the invention. As each packet is received 401, a determination is made as to whether there are enough valid packets (DOFs) to begin the standard NC decoding process 402. If there are not enough valid packets, the subject PPRNC process 404 can attempt to recover the partial packets. The success of the PPRNC process determines the next step 405. If the PPRNC process was successful, then decoded packets 406 can be provided to higher layers of the protocol stack. If the PPRNC process was not successful, then at least one other packet is needed 407. The next packet can be received 401 and a determination is made as to whether there are enough valid packets to begin the standard NC decoding process 402. If there are still not enough valid packets, the PPRNC process 404 is invoked again and the process can be repeated. In certain embodiments a particular number of total packets (a combined number of valid and partial packets) can be required before the first invocation of the PPRNC.

Figure 5:
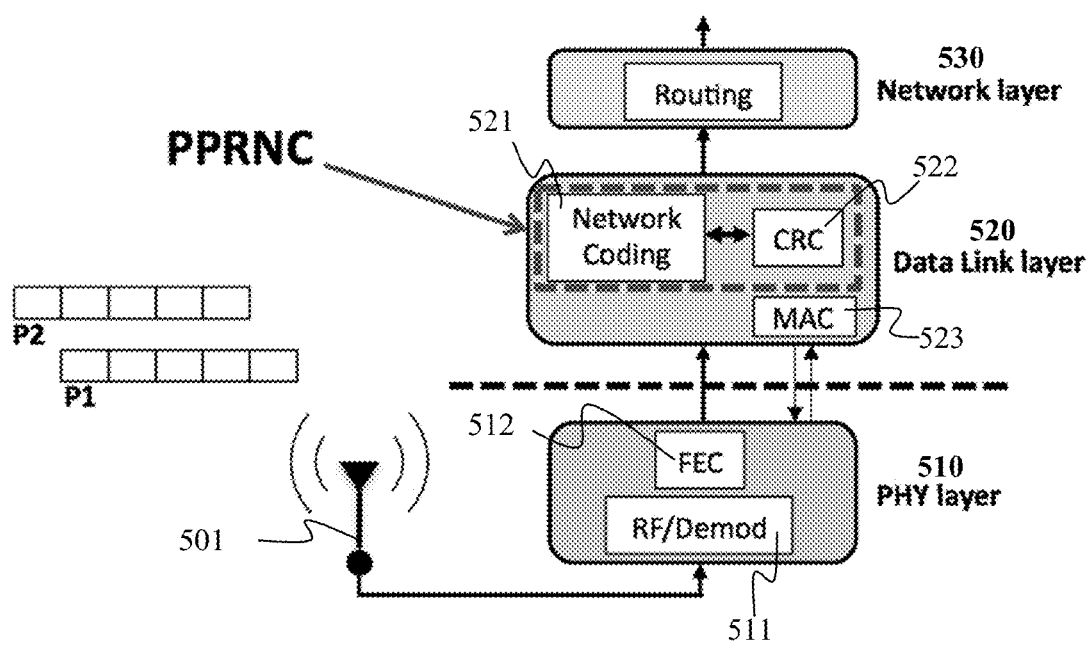
FIG. 5 shows a block diagram of a protocol stack in a receiver using PPRNC.

A simplistic block diagram of a potential protocol stack in a receiver on which PPRNC can be implemented is shown in FIG. 5. A physical PHY layer 510, data link layer 520, and network layer 530 are shown. The PPRNC is associated with the data link layer 520 and provides a network coding 521 and error detection (e.g., CRC 522) function. The functions of the PPRNC can be transparent to higher layers (such as the network layer 530). Decoded packets are sent to the network layer 530 after processing. According to certain embodiments providing transparent services, the packets are delivered to higher layers in a batch mode after having a successful decoding.

A MAC 523 can be provided as part of the data link layer 520 for sending data to and receiving data from the physical layer 510, as well as provide addressing and access control/protocols.

The physical layer 510 of the receiver receives a signal from, for example, an antenna 501, and extracts the bits from the received signal. The signal can be a radio frequency (RF) signal that is converted from analog to digital and demodulated to recover the digital signal transmitted from a transmitter (via RE/demodulation 511). A standard NC encoding process may be used in the transmitter's data link layer (transmitter not shown) when transmitting the packets P2 and P1.

One or more physical layer error correction schemes (e.g., modulation schemes) can be provided in the physical layer 510. Because the PPRNC can be designed as physical layer independent, any modulation scheme (e.g., FEC, H-ARQ) may be used in the physical layer 510. The PPRNC of embodiments of the invention can treat the physical layer as a black box, receiving PHY's output as the best estimate about the transmitted information, without having any knowledge about its implementation details (interleaving, FEC code, etc.). A physical layer dependent implementation of PPRNC can be implemented in a similar manner as the one described above with an extra input to the data link layer from the physical layer, providing the soft information.

FIG. 5 shows an embodiment incorporating a FEC decoder 512, which pushes a best estimate about received data to the data link layer 520. If the CRC rule is not satisfied for a specific estimate of a bit stream sent by the FEC decoder 512 of the physical layer 510, the PPRNC buffers the packet of the specific estimate. The recovery algorithm of the PPRNC tries to correct the packet's erroneous bits and start the NC decoding process even when the number of valid packets is less than the generation size.

Applying the implementation described with respect to FIG. 5 to the process flow illustrated in FIG. 4, packets can be received at the physical layer 510 of a receiver (401). The receiver's physical layer 510 can capture, via antenna 501, an RE signal corresponding to a transmitted coded packet (as well as information regarding DOF). In the physical layer, demodulation and error correction can be performed (see for example RF/Demod 511 and FEC 512 process modules in FIG. 5). Soft information or any confidence metric or hint can also be created. The demodulated data stream can be provided as packets to the data link layer in a serial stream of bits, potentially augmented by related soft information. Once in the data link layer, the correctness of packets can be evaluated according to a CRC. For example, in one embodiment, the FEC decoding provides a best estimate about the received information to the data link layer; and, in the data link layer, if the estimate satisfies a checksum rule (e.g., a simple error detection routine detecting common errors according to a numerical value that may accompany the packet), the packet is stored (e.g., buffered) and indicated as a valid DOF. Instead of discarding partials, embodiments of the invention perform a PPRNC process to attempt the recovery of the partial packets. As previously explained, an NC decoding process starts as soon as the number of valid DOFs becomes equal to the generation size. Accordingly, the number of valid DOFs is checked after each packet undergoes CRC (402). If enough valid DOB are stored to begin the standard NC decoding process, then the NC decoding process can be performed (403).

However, because embodiments leverage the information contained in the partial packets, it is possible to decode the received packets even when the number of valid packets is less than the required number of DOFs, enabling the NC decoding process to begin with less valid DOFs (by using the PPRNC process including the network coding 521 and CRC 522). After the successful decoding 406, the initial packets can be delivered to higher layers of the protocol stack, such as the network layer 530.

Embodiments of the invention detect corrupted information in partial packets and utilize the partial packets in recovering data. Since involving PHY soft information to detect erroneous parts of packets is not a prerequisite, embodiments can be implemented in almost any network environment because PHY soft information is not always available to higher layers. If the PHY soft information is available, the soft information can be utilized in the error correction process.

Further, by not requiring every block of a packet to have its own CRC, embodiments can minimize the overhead needed for each transmitted packet (because even the successfully received packets would have had a CRC). Instead, the PPRNC method of embodiments of the invention checks the validity of symbols in received packets through a consistency check rule based on NC. The rule exploits a NC property, according to which any set of enough valid DOFs can be decoded, recovering the initial packets. Then, given the coefficients associated with another coded packet, the consistency check rule examines the other coded packet's correctness by regenerating the packet and comparing the packet with its current value.

In accordance with embodiments of the invention, PPRNC is able to identify correct and erroneous parts of partial packets using a rateless coding technique. In addition, by using an iterative algorithm, an attempt is made to correct the erroneous parts according to information contained in other valid packets, since the coding process of PPRNC is performed across packets and not within a packet. In PPRNC, when the physical layer returns a partial packet, the partial packet is buffered by the link layer and automatically becomes redundancy for all the other packets across the packet's generation. Advantageously, when packets are received without errors, no extra overhead is associated with them.

A greater understanding of the present invention and of its many advantages may be had from the following examples, given by way of illustration. The following examples are illustrative of some of the methods, applications, embodiments and variants of the present invention. They are, of course, not to be considered in any way limitative of the invention. Numerous changes and modifications can be made with respect to the invention.

EXAMPLE

Experiment Set-up and PPRNC Algorithm

The performance of the PPRNC recovery mechanism is simulated and its performance compared with other reported partial recovery mechanisms.

The experimental test set-up is a simple communication arrangement composed of only two wireless nodes. Development Boards from Texas Instruments, equipped with CC2500 2.4 GHz RF radio modules (transmitting at the 2.4-2.483 GHz ISM band), are used to create real data-traces. The boards communicated transmission data to a PC through USB connection. SmartRF Studio was used to configure the CC2500's registers and uVision Programming Suite was used to program the microcontroller's firmware. Supported modulation schemes by the RF radio modules are OOK, 2-FSK and MSK, while the output transmission power can be programmed in the range of −30 dBm to +1 dBm, and the transmission rate up to 500 KBaud. Several data traces were created by capturing transmission data and processed off-line.

Figure 6:
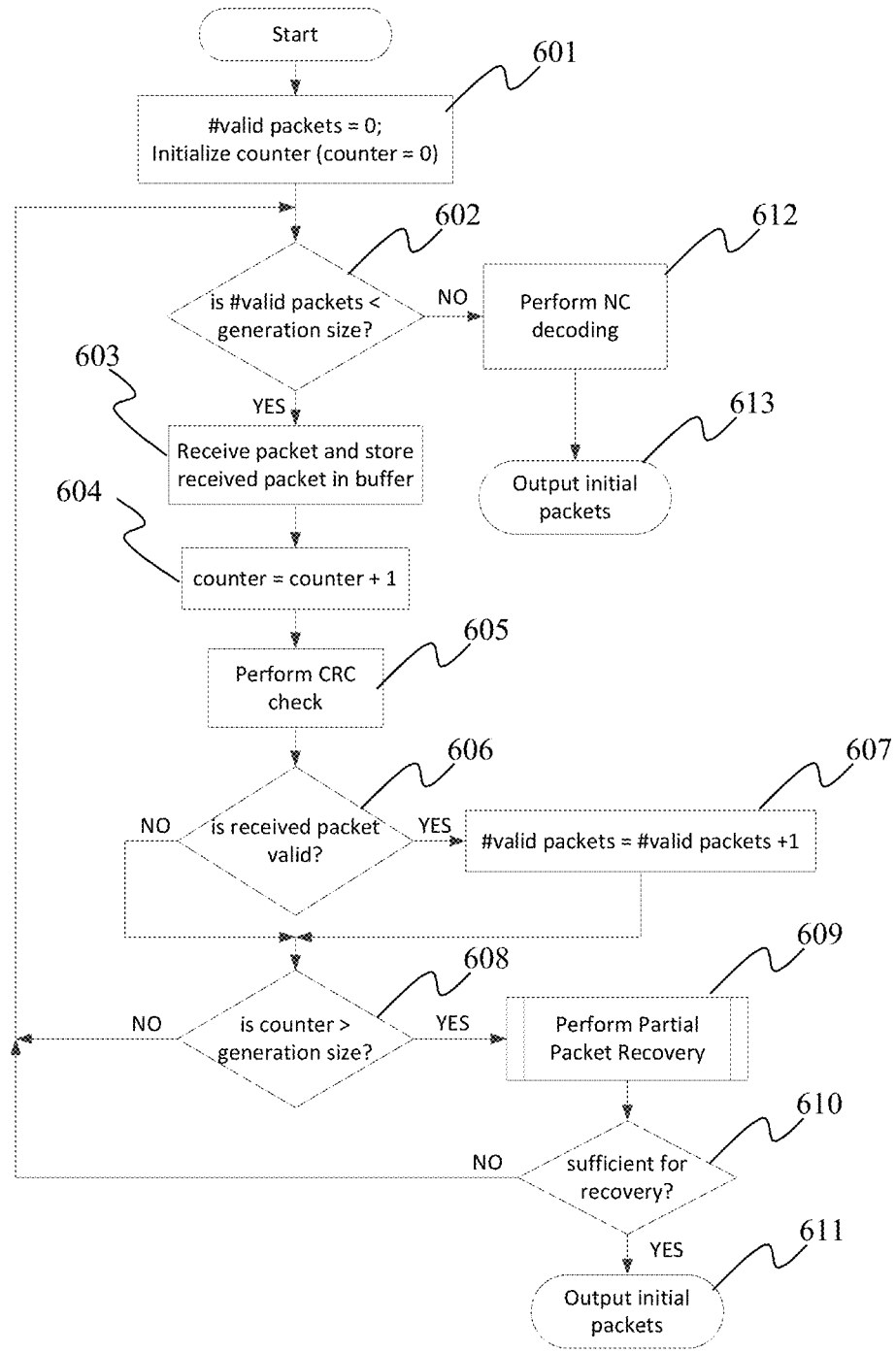
FIG. 6 shows a process flow diagram of a link layer process running at a receiver for performing PPRNC in accordance with one embodiment of the invention.

To evaluate the PPRNC technique, the collected traces were processed off-line using a PPRNC recovery algorithm in accordance with an embodiment of the invention. Algorithm 1, Algorithm 2, and Algorithm 3 illustrate the processes performed for the PPRNC algorithm in the experimental embodiment. As described in Algorithm 1 (and illustrated in FIG. 6), as soon as the total number of incoming packets (including valid and partial) becomes greater than the generation size, PPRNC tries to start the decoding process utilizing the partial packets. Referring to FIG. 6 and Algorithm 1, after initialization 601 and while the number of valid packets is less than the generation size 602, each packet is received, undergoes a CRC and is buffered 603, 605. A counter indicating number of packets can be incremented 604 when each packet is received. The outcome of the CRC indicates whether the received packet is valid 606. If the received packet is valid, a counter indicating the number of valid packets can be incremented 607. A determination is also made as to whether the number of received packets is greater than generation size 608. If the number of received packets is greater than the generation size, then a partial packet recovery process (PPRNC) 609 in accordance with an embodiment of the invention is attempted. If the partial packet recovery process is sufficient for recovery (610), the initial packets decoded during the partial packet recovery process is output 611. If the total number of packets is not greater than the generation size (608) and the number of valid packets is less than the generation size (602), then a next packet is received and the process repeats (603-610). If the total number of packets is not greater than the generation size but the number of valid packets is less then the generation size (602) than NC decoding can be performed 612 and the initial packets output 613.

Algorithm 1

Pseudocode of the link layer process running at the receiver, triggered when a new packet is received.

```
Input: pack_received
Output: P_init = Initial packets
1: #valid_packs = 0, count = 0;
```

Algorithm 1-continued

Pseudocode of the link layer process running at the receiver, triggered when a new packet is received.

```
 2: while #valid packs<Gen size do
 3:   p = pack_ received;
 4:   count++;
 5:   P'_inc =[P'_inc; p];
 6:   #valid packs = check CRC(P'_inc);
 7:   if count>Gen size then
 8:     [success;P_init= Recover(P'_inc);
 9:     if success is true then
10:        return P_init;
11:     endif
12:   endif
13: endwhile
14: P_init = NC_Decoding(P'_inc);
15: return P_init;
```

Figure 7:
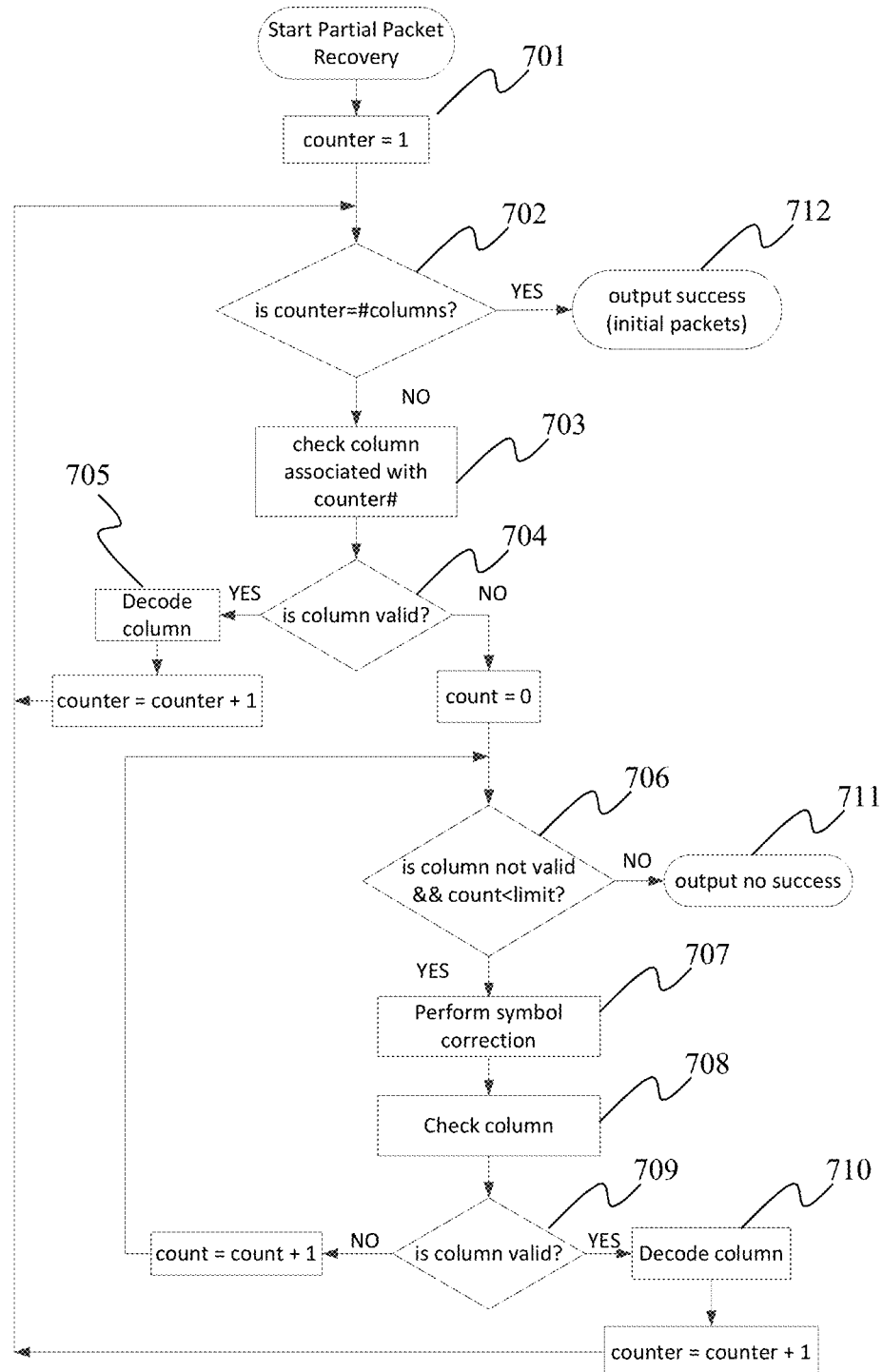
FIG. 7 shows a process flow diagram of the partial packet recovery subprocess 609 indicated in FIG. 6 in accordance with an embodiment of the invention.

During the partial packet recovery process 609, PPRNC processes the buffered packets (P'_inc), working across columns, and finishes the recovery process only when all columns are successfully decoded, as shown in Algorithms 2 and 3 (and illustrated in FIG. 7). Otherwise, a failure is declared and a new packet is requested. Referring to FIG. 7 and Algorithms 2 and 3, after initialization of the partial packet recovery process 701 and while columns remain for the received packets 702, a consistency check is performed tier a column being evaluated 703. If the column is valid (704), then the column can be decoded 705 and the next column (if there is a next column 702) is evaluated (703 and 704). If the column fails the consistency check (704), then while the column continues to fail a consistency check but has attempted correction less than a set number of times 706, symbol correction is performed 707 and checked 708. For example, a searching algorithm can be used to try different possible combinations, starting with the ones of highest probability of occurrence, until the consistency check is satisfied (708 and 709). In case soft information is available to data link layer, the soft information can be utilized to identify symbols or parts of packets, which are most likely erroneous. If the symbol correction is successful (consistency check indicating valid column), the column can be decoded 710 and the next column (if there is a next column 702) is evaluated (703 and 704). If the symbol correction process 707 is attempted without success (consistency check indicating failure) for the set number of tries, the partial packet recovery process provides an output that no success was achieved 711. Once all columns have been checked and decoded 702, the partial packet recovery process provides an output indicating that success was achieved and can provide the initial packets 712.

Algorithm 2

Pseudocode of the partial packet recovery process (Recover).

```
Input: P'_inc = Incoming packets
Output: success, Recovered_packets = P_recov
 1: success =1;
 2: count =1;
 3: while (count <= #cols P'_inc) && (success =0) do
 4:    [flag; P_recov_col]= Recover_column (P'_inc(:,count));
 5:    if (flag =0) then
 6:       P_recov =[P_recov;P_recov_col];
 7:       count++;
 8:    else
 9:       success =0;
10:    endif
11: endwhile
12: return [success; P_recov];
```

Algorithm 3

Pseudocode of the per column recovery process (Recover column).

```
Input: coef; Incoming col = Inc col
Output: flag; Recovered_col = Recov_col
 1: [val_col; inv col]= seperate(Inc_col);
 2: [val_coef; inv_coef]= seperate(coef);
 3: test_col =[val_col; inv_col(1: Gen_size - #val col)];
 4: test_coef =[val_coef; inv_coef(1: Gen size - #val col)];
 5: [check; gues_col]= consistency_check (test_col; test_coef;
 6: if check is true then
 7:    Recov_col = gues_col;
 8: else
 9:    count =0;
10:    while (check is false)&&(count<limit) do
11:       test_col = correction_process (test_col);
12:       [check; gues_col] = consistency_check (test col, test coef);
13:       if check is true then
14:          Recov_col = gues_col;
15:       else
16:          count ++;
17:       endif
18:    endwhile
19: endif
20: return Recov_col;
```

EXAMPLE

Trace Collection, Channel Measurements

For the experiments, FSK modulation, 250 kBaud transmission rate, variable output power as well as packet length was used. The packet format was the following: 6-byte preamble, 2-byte synchronization word, variable length data field and optional 2-byte CRC check. Transmitter and receiver had a 5 m line-of-sight distance and they were located in a typical indoor campus environment. At the physical layer, a rate 1/2 convolutional code and an interleaver were used. Depending on the experiment, the 2-byte CRC field was selectively activated and deactivated in counting the valid and erased packets at the receiver, Measurements were taken across several days and hours; their average was calculated and presented in FIG. 8.

Fading, noise, interference and other wireless channel characteristics degrade signal quality and usually cause corruption of the transmitted information. Errors in the payload of the packets result in the reception of partial packets, whereas errors in the preamble or the sync word usually result in erased packets, i.e. no information is captured for these packets. The performance of any partial packet recovery mechanism depends on the portion of transmitted packets which are received as partial, because if the number of erased packets is large or if the number of partial packets is small, then the benefits of such a mechanism would be very limited. Accordingly, the number of packets received as partial across different channel conditions as well as the ratio of erased packets over the partial ones was examined.

Figure 8:
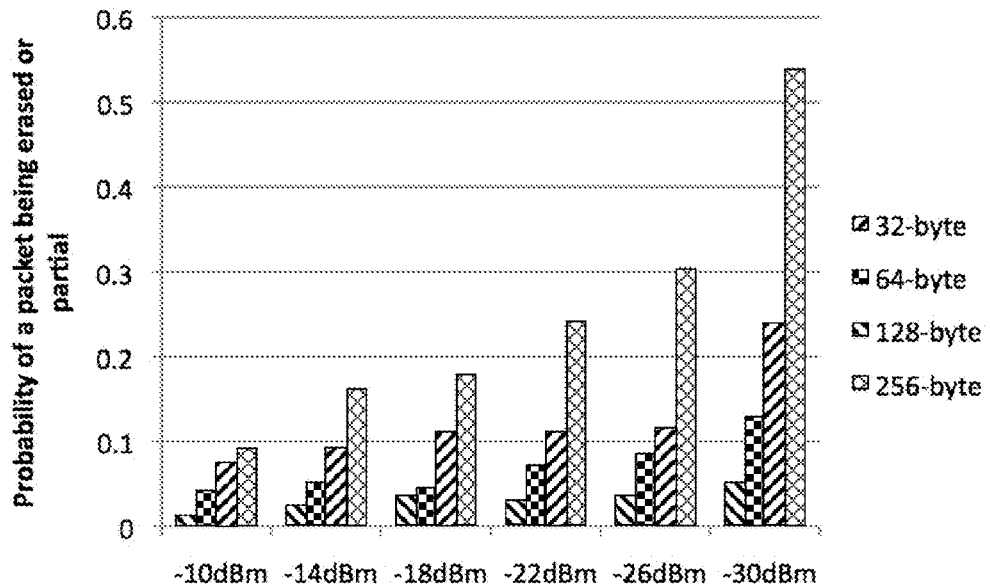
FIG. 8 shows a bar chart indicating average probability of a packet being erased by a channel or discarded after a CRC check, with varying packet lengths and output power levels.

Based on the collected traces with the CRC check enabled, the number of packets that were successfully received was counted to provide channel measurement results. FIG. 8 shows a plot of the probability of a packet being either erased by the channel or discarded as partial by the link layer, which is usually called erasure probability. Owing to the static, short range communication link for the experimental set-up, the transmitter's output power was significantly lowered in order to challenge the system in the low SNR regime.

For output power levels higher than −10 dBm, only a few packets were not received and those results are not included in the graph. As expected, the probability increases as the transmission power is lowered and longer packets are transmitted. In addition, the measurements indicate that the ratio of erased packets over the partial ones for various output power levels is very small (approximately≈$10^{-3}$). Thus, a partial packet mechanism would highly improve system's performance.

EXAMPLE

Simulation and Results

Simulation of the PPRNC was implemented in software to evaluate the performance offline without use of PHY's soft information.

The reduction of retransmitted packets compared to a traditional scheme, which discards partial packets, clearly illustrates the amount of information contained in these packets. PPRNC is also compared with other partial packet recovery mechanisms in terms of their ability to exploit this particular kind of information. In particular, the PPRNC is compared to the following two schemes:

ARQ: This scheme requests a new retransmitted packet every time a partial packet reaches receiver's data link layer. Its simplicity is the main reason for its popularity. However, this simplicity contributes to ARQ's poor performance, since partial packets are discarded.

Ideal H-ARQ: A hypothetical recovery mechanism which has the ability to recover any received packet with at most two transmissions. So, if a packet is received partial, this ideal recovery mechanism guarantees that, with its upcoming retransmitted copy, successful recovering will take place, even if the second retransmitted packet is partial. As it becomes clear, this is the best case scenario for the family of partial packet recovery mechanisms performing coding within a packet. In this category lie mechanisms such as Type I and II H-ARQ schemes and other cross-layer techniques, such as ZipTx (K. C.-J, Lin et al., "ZipTx: Harnessing partial packets in IEEE 802.11 networks," *Proc. of the 14th ACM Int'l. Conf. on Mobile Computing and Networking*, 2008, pp. 351-362).

Figure 9:
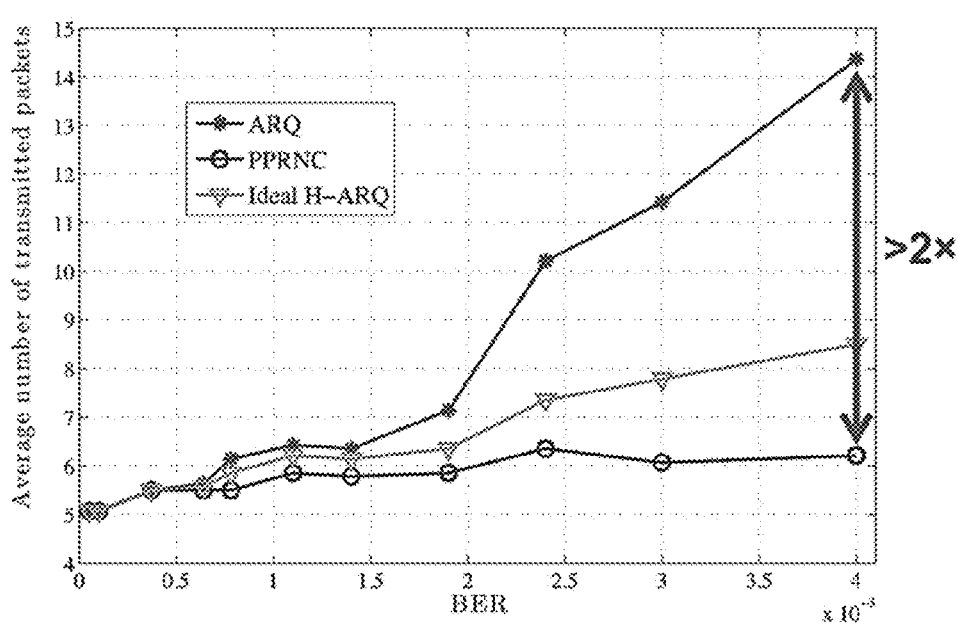
FIG. 9 is a plot showing a performance comparison among ARQ, an ideal H-ARQ scheme, and a PPRNC scheme in accordance with an example embodiment of the invention.

FIG. 9 shows a plot of the expected number of transmitted packets (including the retransmitted ones) required by the source to communicate 5 packets to the destination as the bit error rate (BER) increases. The performance of ARQ scheme is expected to follow the curve of the expected number of transmitted packets $$\overline{N} = \frac{N}{1-p},$$

while performance of the ideal H-ARQ scheme is expected to be much better. Indeed, as shown in the plot of FIG. 9, the ideal H-ARQ scheme performs better, especially in the high BER regime.

The PPRNC technique without use of soft information of the example embodiment of the invention performs even better than this ideal H-ARQ scheme. With one or two extra partial packets, PPRNC can successfully recover the initial transmitted packets. The reduction in the total transmitted packets is more than a factor of two compared to the ARQ scheme, which represents the traditional all-or-nothing approaches discarding partial packets. Compared to the ideal H-ARQ scheme, the reduction is approximately 25% at the high BER regime, making PPRNC a very good candidate among the partial packet recovery mechanisms. Indeed, based on the indoor channel measurements, PPRNC can outperform current partial packet recovery mechanisms.

The simulation and implementation results reveal that exploiting information contained in partial packets can significantly increase (close to a factor of ×2) the throughput of a wireless communication pair, especially under challenged channel conditions. In addition, PPRNC outperforms the ability of proposed partial packet recovery mechanisms to extract useful information from partial packets, which can result in approximately 20% reduction in the required number of retransmitted packets in highly challenged environments.

Based on the simulation and implementation result, it can be seen that exploiting information contained in partial packets can significantly improve the performance of wireless networks, resulting in better resource utilization and higher throughput.

As indicated by the simulation and certain implementations of the invention, embodiments of the invention can push the aggregate network capacity even higher than the throughput available to wireless networks using NC by reducing the required number of retransmitted packets and increase the effective link reliability. The benefits of any partial packet recovery technique depends on the portion of received partial packets compared to total number of transmitted ones, which, in turn, depend on protocol and channel specific parameters.

The general partial packet recovery framework described herein can be incorporated in a wide variety of wireless networks including, but not limited to, Body Area Networks (BANs) and WLANs.

PPRNC does not require physical layer soft information to be exposed to it, making embodiments of the PPRNC method easily deployable in current wireless networks. However, the existence of soft information can simplify the correction process, resulting in reduced execution time.

The recovery mechanism does not introduce transmission overhead for correctly received packets. If a packet does not satisfy the CRC check, it is buffered and automatically becomes redundancy. No extra information is transmitted per packet, such as block-based CRCs or known pilot bits, that could potentially indicate the erroneous parts of a packet.

PPRNC considerably simplifies the feedback process, since the receiver does not have to explicitly declare the parts of packets or even the specific packets which got corrupted during the transmission, making the amount of information sent by the receiver as feedback minimum.

The computational requirements of PPRNC's recovery algorithm can be easily adapted to the available resources, balancing the recovery performance with the algorithmic complexity.

Certain techniques set forth herein may be described in the general context of computer-executable instructions, such as program modules, executed by one or more computers or other devices. Certain embodiments of the invention contemplate the use of a computer system or virtual machine within which a set of instructions, when executed, can cause the system to perform any one or more of the methodologies discussed above. Generally, program modules include routines, programs, objects, components, and data structures that perform particular tasks or implement particular abstract data types.

It should be appreciated by those skilled in the art that computer-readable media include removable and non-removable structures/devices that can be used for storage of information, such as computer-readable instructions, data structures, program modules, and other data used by a computing system/environment. A computer-readable medium includes, but is not limited to, volatile memory such as random access memories (RAM, DRAM, SRAM); and non-volatile memory such as flash memory, various read-only-memories (ROM, PROM, EPROM, EEPROM), magnetic and ferromagnetic/ferroelectric memories (MRAM, FeRAM), and magnetic and optical storage devices (hard drives, magnetic tape, CDs, DVDs); or other media now known or later developed that is capable of storing computer-readable information/data. Computer-readable media should not be construed or interpreted to include any propagating signals.

Of course, the embodiments of the invention can be implemented in a variety of architectural platforms, devices, operating and server systems, and/or applications. Any particular architectural layout or implementation presented herein is provided for purposes of illustration and comprehension only and is not intended to limit aspects of the invention.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

It should be understood that the examples and embodiments described herein are for illustrative purposes only and that various modifications or changes in light thereof will be suggested to persons skilled in the art and are to be included within the spirit and purview of this application.

We claim:

1. A method for data recovery in a wireless network, the method comprising:
    receiving a plurality of coded packets; and
    performing data recovery of partial packets of the plurality of coded packets across the plurality of coded packets, the partial packets of the plurality of coded packets each containing at least one erroneous bit, the plurality of coded packets including the partial packets being buffered in a memory and at least one of the partial packets of the plurality of coded packets being used in performing the data recovery.

2. The method of claim 1, wherein performing the data recovery comprises:
    detecting corrupted information in the partial packets by performing a consistency check for validity of symbols across the plurality of coded packets.

3. The method according to claim 2, wherein performing the consistency check comprises:
    decoding any set of symbols, the set of symbols containing symbols from at least two coded packets of the plurality of coded packets and a total number of symbols of the set of symbols being at least a generation size;
    using coefficients associated with a remaining coded packet or packets not having a symbol contained in the decoded set of symbols to obtain a regenerated coded symbol of the remaining coded packet or packets; and
    comparing the regenerated coded symbol with a coded symbol of the remaining coded packet or packets to obtain a consistency check result.

4. A wireless network node comprising:
    an antenna;
    a processor;
    a memory; and
    a data recovery module having instructions that when executed by the processor cause the wireless network node to perform data recovery of partial packets of a plurality of coded packets, the partial packets of the plurality of coded packets each containing at least one erroneous bit, the plurality of coded packets being received via the antenna and buffered in the memory for performing the data recovery across the plurality of coded packets, at least one of the partial packets of the plurality of coded packets being used in performing the data recovery.

5. The wireless network node of claim 4, wherein the data recovery module is executed at a data link layer of the wireless network node.

6. The wireless network node of claim 4, wherein the data recovery module has instructions, that when executed by the processor, cause the wireless network node to:
    perform an error detection check of each coded packet of the plurality of coded packets received via the antenna to determine an error check result, the error check result indicating a valid packet or a partial packet; and store the coded packet and the error check result in the memory; and
    perform the data recovery when the number of coded packets received and stored in memory is greater than a generation size (g), the data recovery comprising:
        performing a consistency check for a symbol-column of the coded packets stored in the memory, a symbol-column being a same position portion of each of the coded packets; and
        decoding the symbol-column of the coded packets after obtaining a success from performing the consistency check.

7. The wireless network node of claim 6, wherein the consistency check is performed column-by-column, the column-by-column check progressing in a direction from a first position portion to an end position portion.

8. The wireless network node of claim 6, performing the consistency check for the column comprises:
    obtaining a decoded portion for each of the generation size g number of the coded packets stored in the memory by performing:

$$\begin{bmatrix} D_{i_1 j} \\ \vdots \\ D_{i_g j} \end{bmatrix} = \begin{bmatrix} C_{i_1} \\ \vdots \\ C_{i_g} \end{bmatrix}^{-1} \times \begin{bmatrix} P_{i_1 j} \\ \vdots \\ P_{i_g j} \end{bmatrix},$$

where $i_n$ indicates a particular coded packet of the coded packets for n=1 to a total of g packets of the coded packets, j is the position of the portion, D is the decoded portion, C is the coefficients of the coded packet, and P is the portion of the coded packet;
    obtaining a regenerated coded portion for each remaining coded packet of the coded packets stored in the memory by performing:

$$D_{rj} = C_r \times \begin{bmatrix} D_{i_1 j} \\ \vdots \\ D_{i_g j} \end{bmatrix}$$

where r indicates a remaining particular coded packet of the coded packets; and comparing $D_{rj}$ with $P_{rj}$ to obtain a comparison result, the comparison result being a success result or an invalid result.

9. The wireless network node of claim 8, further comprising performing the consistency check for the column at least two times using different particular coded packets and remaining particular coded packet.

10. A method for data recovery in a wireless network, comprising:
receiving a first number of coded packets at a receiver, the coded packets each comprising coefficients and at least two symbols,
wherein for each of the first number of coded packets received at a receiver:
performing an error detection check of the coded packet to determine an error check result, the error check result indicating a valid packet or a partial packet; and
storing the coded packet and the error check result in a memory, wherein coded packets indicated as partial packets are stored in the memory;
performing a consistency check for a column of a subset of the first number of coded packets stored in the memory, a column being a same position portion of each of the first number of coded packets; and
decoding the column of the subset of the first number of coded packets after obtaining a success from performing the consistency check.

11. The method according to claim 10, wherein the performing of the consistency check is performed column-by-column, the column-by-column check progressing in a direction from a first position portion to an end position portion.

12. The method of claim 10, wherein the first number of coded packets is larger than a generation size (g), wherein the subset of the first number of coded packets has g packets of the first number of coded packets, wherein performing the consistency check for the column comprises:
obtaining a decoded portion for each of the g number of the first number of coded packets by performing:

$$\begin{bmatrix} D_{i_1 j} \\ \vdots \\ D_{i_g j} \end{bmatrix} = \begin{bmatrix} C_{i_1} \\ \vdots \\ C_{i_g} \end{bmatrix}^{-1} \times \begin{bmatrix} P_{i_1 j} \\ \vdots \\ P_{i_g j} \end{bmatrix},$$

where $i_n$ indicates a particular coded packet of the coded packets for n=1 to a total of g packets of the coded packets, j is the position of the portion, D is the decoded portion, C is the coefficients of the coded packet, and P is the portion of the coded packet;
obtaining a regenerated coded portion for each remaining coded packet of the first number of coded packets by performing:

$$D_{rj} = C_r \times \begin{bmatrix} D_{i_1 j} \\ \vdots \\ D_{i_g j} \end{bmatrix}$$

where r indicates a remaining particular coded packet of the first number of coded packets; and
comparing $D_{rj}$ with $P_{rj}$ to obtain a comparison result, the comparison result being a success result or an invalid result.

13. The method of claim 12, further comprising performing the consistency check for the column at least two times using different particular coded packets and remaining coded packet or packets.

14. The method according to claim 12, wherein when the comparison result is the invalid result, the method further comprises performing an iterative correction process to identify correct values for the portions of the column corresponding to coded packets indicated as being partial packets by the error detection check,
wherein the iterative correction process comprises repeatedly performing a searching algorithm and the consistency check to try different possible combinations of values for the portions of the column corresponding to coded packets indicated as being partial packets by the error detection check until the consistency check indicates the success.

15. The method of claim 14, further comprising:
performing the error detection check for at least one coded packet after performing the iterative correction process to update the error check result stored in memory.

16. The method according to claim 14, wherein when an error is detected by the consistency check of the iterative correction process, symbols to be modified by the searching algorithm are prioritized for correction according to soft information or data about the symbols' reliability.

17. The method according to claim 14, wherein the searching algorithm uses soft information to try the different possible combinations of values for the portions of the column corresponding to coded packets indicated as being partial packets starting with symbols indicated as least confident according to the soft information.

18. The method according to claim 17, wherein the searching algorithm is executed at a data link layer, the soft information being available to the data link layer from a physical layer.

19. The method of claim 10, wherein decoding the column comprises:
obtaining a decoded portion for the first number of coded packets by performing:

$$\begin{bmatrix} D_{x_1 j} \\ \vdots \\ D_{x_y j} \end{bmatrix} = \begin{bmatrix} C_{x_1} \\ \vdots \\ C_{x_y} \end{bmatrix}^{-1} \times \begin{bmatrix} P_{x_1 j} \\ \vdots \\ P_{x_y j} \end{bmatrix},$$

where $x_n$ indicates a particular coded packet of the first number of coded packets for n=1 to a total y of the first number of coded packets, j is the position of the portion, D is the decoded portion, C is the coefficients of the coded packet, and P is the portion of the coded packet.

20. A computer readable medium having computer-readable instructions stored thereon that, when executed by a processor, cause a device to perform the method of claim 10.

* * * * *